United States Patent Office 3,036,916

Patented May 29, 1962

3,036,916
POLYMERIZABLE ELEMENTS

Norman Thomas Notley, Highland Park, N.J., assignor to E. I. du Pont de Nemours and Company, Wilmington, Del., a corporation of Delaware No Drawing. Filed June 16, 1958, Ser. No. 742,035
6 Claims. (Cl. 96—84)

This invention relates to improved addition polymerizable elements, e.g., sheets and plates, which have good stability with respect to the influence of oxygen upon storage. More particularly, it relates to such elements which have relatively thick addition-photopolymerizable layers suitable for making halftone and line printing plates and a continuous layer which counteracts the absorption of deleterious amounts of oxygen.

Photopolymerizable elements useful for making printing relief are described in Plambeck U.S. Patent 2,791,504. These elements have a photopolymerizable layer comprising a polymeric binder, an addition polymerization initiator activatable by actinic light, and an addition polymerizable ethylenically unsaturated compound capable of forming a high polymer by photoinitiated addition polymerization in the presence of such an initiator on a suitable support. These elements usually contain antihalation material which is generally in a layer or stratum beneath the relief-height forming portion of the photopolymerizable layer. Usually there is an anchor layer between the photopolymerizable layer and the base sheet or plate. This provides for the adherence of the layers to the base which generally is made of metal. Antihalation material can be in or on this anchor layer. Certain of these plates, particularly those which contain esters of acrylic acid, upon storage become less sensitive to light due to diffusion of oxygen from air into the photopolymerizable layer.

The antihalation and anchor layers described in the Plambeck patent do not prevent the concentration of oxygen in the photopolymerizable composition from increasing throughout to its saturation level. In this condition, the polymerization rate at points deep in the photopolymerizable composition, where the light intensity is necessarily lower than at the surface, may be adversely affected with respect to the photopolymerization rate at the top surface. There is a tendency for the top surface to be over-exposed before the optimum exposure of the lower surface is reached with a consequent loss of exposure latitude. A point may, therefore, be reached where no satisfactory exposure of the element is possible. The result is that an element is formed which has an undercut, poorly anchored relief image with characters which are plugged.

An object of the present invention is to provide improved, stable photopolymerizable elements. Another object is to provide such elements which overcome the above-described shortcomings of prior art elements. A further object is to provide new elements which have a layer or stratum that counteracts deleterious effects due to the diffusion of oxygen into a photopolymerizable layer. Still further objects will be apparent from the following description.

The photopolymerizable elements of this invention comprise (1) a support which may be a sheet or plate, planar or curved, that may have an anchor layer or layers on its upper surface, (2) a layer containing an oxygen reactant and (3) in surface contact with layer (2), a photopolymerizable layer having a thickness of 3 to 250 mils and preferably 10 to 80 mils, and comprising (*a*) a cellulose carboxylic acid ester, (*b*) an ethylenically unsaturated monomer capable of forming a high polymer by photoinitiated addition polymerization and (*c*) an addition polymerization initiator activatable by actinic light and thermally inactive below 85° C.

The oxygen reactants referred to above should react with oxygen at the interface of layers (2) and (3) at a rate substantially greater than that at which the oxygen in air can diffuse through layer (3). To be more specific, they should react with oxygen of air at a rate greater than Y milligrams of oxygen per year per square centimeter of interface. This rate can be represented by the formula $$Y=P\times 5\times 10^7$$

where P expressed in cubic centimeters per second per square centimeter is the permeability of said layer to oxygen when the pressure differential is one atmosphere of air.

It should be appreciated that in the novel photopolymerizable elements of this invention one does not remove all the oxygen from the system, but rather, imposes an oxygen gradient, highest at the top surface and zero at the oxygen reactant surface. The effect of this gradient is directly opposed to the general tendency for faster photopolymerization at the top surface. Consequently, this structure tends to produce the maximum exposure latitude.

It has been found that red phosphorus, stannous chloride, and chromous chloride are very effective as the oxygen reactants. Mixtures of two or more of these compounds can be used. They have the advantage that they do not react with or have a deleterious effect on the constituents in the photopolymerizable layer.

The layer containing the oxygen reactant can be formed in the same way as the antihalation layers are formed in the photopolymerizable elements of Plambeck U.S. Patent 2,791,504 by mixing finely divided particles or crystals of the oxygen reactants with a suitable solvent or diluent containing a polymer or resin binding agent. Indeed, antihalation dyes or pigments can be admixed with the oxygen reactants and a composite oxygen-reactive, antihalation layer coated on the supporting surface. Suitable binding agents include vinyl copolymers, e.g., vinyl chloride with vinyl acetate, diethyl fumarate, ethyl acrylate, allyl glycidyl ether, or glycidyl methacrylate; vinyl chloride/vinyl acetate/maleic anhydride copolymer; polyvinyl butyral; monomeric dimethylacrylate esters of the polyethylene glycols in combination with vinyl chloride copolymers; and styrene or diallyl phthalate with polyesters such as diethylene glycol maleate, diethylene glycol maleate/phthalate, triethylene glycol fumarate/sebacate, etc. Particularly useful binders are the copolyesters made from ethylene glycol, dimethyl hexahydroterephthalate, dimethyl sebacate, and dimethyl terephthalate. These polyesters can be made in accordance with the procedures disclosed in Whinfield and Dickson U.S. Patent 2,465,319 and Snyder U.S. Patents 2,623,031 and 2,623,033. Adhesive compositions containing such copolyesters are described in assignee's Chambers application Serial No. 718,410, filed March 3, 1958.

In an exemplary procedure an adhesive coating composition comprising (1) 75 parts of a linear copolyester made from the reaction mixture of an excess of ethylene glycol and dimethyl hexahydroterephthalate (80 mole percent), dimethyl sebacate (10 mole percent), and dimethyl terephthalate (10 mole percent); (2) 22.5 parts of triethylene glycol diacrylate, containing 0.1 part by weight of a polymerization inhibitor, p-methoxyphenol; and (3) 2.4 parts of a thermally sensitive initiator, benzoyl peroxide, dissolved in 311 parts of methyl ethyl ketone, is intimately mixed with 0.003 to 10% by weight of red phosphorus, based on the weight of the coating composition, is used to coat a steel plate. In the preparation of the copolyester the dialkyl esters are heated with an excess of dihydric alcohol reactant present, and preferably from 1.5 to 3.0 moles of the dihydric alcohol reactant per mole of dialkyl ester. The excess dihydric alcohol present in distilled off, the coating is dried and a sheet of a milled photopolymerizable mixture of cellulose acetate hydrogen succinate, triethylene glycol diacrylate and anthraquinone is press-laminated to the coated layer on the steel sheet after the manner described in U.S.P. 2,791,504, Example XVII. The resulting photopolymerizable element is stored in air for about one week. A test strip is exposed through a process negative to approximately 10 to 50 watts per second of actinic radiation per sq. in., and the non-image areas washed away using an aqueous solution, preferably dilute sodium hydroxide. The quality of the relief image resulting in such cases was good with no plugging.

In general the layer containing the oxygen reactant will have 0.1 to 500 mgs. per sq. in. It can, of course, be deposited on an antihalation layer or surface. That is, the support can contain an antihalation dye or pigment or may have a layer or stratum of such material on its surface. The antihalation layer should be sufficiently absorptive of actinic light so as to permit reflectance from the combined support of no more than 35% of incident actinic light. The photopolymerizable layer itself can serve as the light-absorptive layer when dyes or pigments or other materials significantly absorptive of actinic light are included in the photopolymerizable layer. The adherent support for the relief-height forming photopolymerizable stratum can be a supporting sheet or stratum of the photopolymerizable layer.

The invention will be further illustrated but is not intended to be limited to the following examples wherein the parts and percentages stated are by weight unless otherwise indicated.

EXAMPLE I

Three and seven-tenths grams of an adhesive composition composed of 100 grams of a copolyester prepared by alcoholysis with an excess of ethylene glycol of a mixture of an 8:1:1 mole ratio of dimethyl hexahydroterephthalate (0.64 mole), dimethyl sebacate (0.08 mole) and dimethyl terephthlate (0.08 mole) in the presence of a calcium acetate (0.30 g.), antimony trioxide (0.10 g.) catalyst; 30 grams of triethylene glycol diacrylate; and 3 grams benzoyl peroxide as a thermal initiator, was dissolved in 7.8 mls. methyl ethyl ketone. The adhesive in solution was then intimately mixed, by stirring with 0.3 gram red phosphorus (moist). A portion of the resulting adhesive solution containing phosphorus was used to coat a 15 cm. by 5 cm. steel plate base support which was 12 mils thick to a coating thickness of 1.5 to 2 mils. A photopolymerizable composition, 40 mils thick, was prepared by the method described in Example 4 of the application of Martin et al., Ser. No. 596,766, filed July 9, 1956, now U.S. Patent 2,927,022, issued March 1, 1960, and consisted of cellulose acetate hydrogen succinate, triethylene glycol diacrylate to which had been added 0.1% anthraquinone and 0.1% methyl ether of hydroquinone. The resultant composition was laminated to the adhesive coated steel support by pressing at 130° C. for 3 minutes under a pressure of 300 pounds per sq. in. The element was placed beneath an 1,800-watt high-pressure mercury arc lamp and exposed through a process negative to 21 watt seconds/sq. in. The unexposed polymer was removed by spray washing for 8 minutes using an 0.08 N aqueous solution of NaOH. A satisfactory printing element was obtained with a relief image of good quality and with no plugging of the characters.

EXAMPLE II

The procedure described in Example I was repeated except that 0.3 gram stannous chloride was intimately mixed with the adhesive solution, replacing phosphorus as the oxygen reactant. A satisfactory printing element was obtained with a relief image of good quality and with no plugging of the characters.

EXAMPLE III

The procedure described in Example I was again repeated. Three-tenths gram chromous chloride was intimately mixed with the adhesive solution as the oxygen reactant replacing phosphorus. A satisfactory printing element was obtained with a relief image of good quality and with no plugging of the characters.

EXAMPLE IV

A photopolymerizable element 15 cm. by 5 cm. was prepared as described in Example I except that no oxygen reactant was mixed with the adhesive solution. The element was stored in air for a week and exposed in 7 watt-second steps to the mercury arc lamp described in Example I. Exposures as great as 50 watt-seconds per sq. in. gave no satisfactory image on washout as described in Example I.

Elements described in Examples I, II and III were prepared and exposed in 7 watt-seconds/sq. in. intervals as indicated above. Satisfactory printing elements were obtained with relief images of good quality and with no plugging of characters within the exposure ranges indicated in Table 1:

*Table 1*

| Oxygen Reactant | Exposure Range (Watt-sec./sq. in.) |
|---|---|
| Red phosphorus | 25 to 53 |
| Stannous chloride | 25 to 46 |
| Chromous chloride | 18 to 53 |

Similar results can be obtained by substituting for the reactants of the example equivalent amounts of sodium sulfide or sodium dihydrogen phosphite. The oxygen reactant may be coated on top of the adhesive layer or below the adhesive next to the base support in addition to the preferred method, which involves mixing it with the adhesive solution. It should be emphasized that the oxygen reactant must react with oxygen at a rate greater than the oxygen diffuses through the photopolymerizable material. It is preferred that the oxygen reactant substance be insoluble in the photopolymerizable layer, so that it will not migrate into the layer. In addition it should not react with the photopolymerizable material.

While it is preferred that the photopolymerizable composition be a mixture of cellulose acetate hydrogen succinate; triethylene glycol diacrylate; anthraquinone; and methyl ether of hydroquinone as the inhibitor, other photopolymerizable compositions of the type described in Plambeck U.S. Patent 2,760,863 might also be used to form solid photopolymerizable layers. Suitable additional compositions are N-methoxymethyl polyhexamethylene adipamide mixtures described in Italian Patent 568,225, October 25, 1957, and corresponding U.S. application Ser. No. 577,829, filed April 12, 1956; the polyester, polyacetal or mixed polyester acetal of Martin, U.S. application Ser. No. 538,277, filed October 3, 1955 now U.S. Patent 2,892,716, issued June 30, 1959; the polyvinyl alcohol derivative compositions of Martin, U.S. application Ser. No. 604,006, filed August 14, 1956, now U.S. Patent 2,902,365, issued September 1, 1959, and corresponding Belgian Patent 560,077 and those comprising cellulose acetate (60% by weight) triethylene glycol diacrylate (40% by weight) anthraquinone, photoinitiator (0.1% based on photopolymerizable material), methyl ether of hydroquinone, polymerization inhibitor (0.1% based on photopolymerizable material).

In the photopolymerizable layers of the elements of this invention there can be used practically any initiator of addition polymerization which is capable of initiating polymerization under the influence of actinic light. The preferred photoinitiators are not significantly activatable thermally at temperatures below 85° C. They should be dispersible in the compositions to the extent necessary for initiating the desired polymerization under the influence of the amount of light energy absorbed in relatively short-term exposures.

A preferred class of addition polymerization initiators activatable by actinic light and thermally inactive below 185° C. is a substituted or unsubstituted polynuclear quinone, which is a compound having two intracyclic carbonyl groups attached to intracyclic carbon atoms in a conjugated six-membered carbocyclic ring, there being at least one aromatic carbocyclic ring fused to the ring containing the carbonyl groups. Suitable such initiators include 9,10-anthraquinone, 1-chloroanthraquinone, 2-chloroanthraquinone, 2-methylanthraquinone, 2-tert-butylanthraquinone, octamethylanthraquinone, 1,4-naphthoquinone, 9,10-phenanthrenequinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, sodium salt of anthraquinone alpha-sulfonic acid, 3-chloro-2-methylanthraquinone, retenequinone, 7,8,9,10-tetrahydronaphthacenequinone, and 1,2,3,4-tetrahydrobenz[a]anthracene-7,12-dione.

Suitable thermal polymerization inhibitors which can be used in addition to the preferred methyl ether of hydroquinone include hydroquinone, and alkyl and aryl-substituted hydroquinones, tert-butyl catechol, pyrogallol, copper resinate, naphthylamines, beta-naphthol, cuprous chloride, 2,6-di-tert-butyl-p-cresol, phenothiazine, pyridine, nitrobenzene and dinitrobenzene. Other useful inhibitors include p-toluquinone and chloranil, and thiazine dyes, e.g., thionine (C.I. No. 920), thionine blue G (C.I. No. 926), methylene blue B (C.I. No. 922) and toluidine blue O (C.I. No. 925).

With regard to the antihalation material, e.g., dye or pigment, which can be beneath and in operative association with the lower surface of the photopolymerizable layer, there should be a sufficient quantity of such material that less than 35% of actinic light incident on the material is reflected into the photopolymerizable layer.

While the base or support for the photopolymerizable elements of this invention are preferably flexible and composed of metal, e.g., aluminum or steel, they can be rigid. Also, they can be made of various film-forming resins or polymers. Suitable supports of these types are disclosed in U.S. Patent 2,760,863, col. 5, lines 14–75, and col. 6, lines 1–15.

The photopolymerizable structures of the present invention are particularly well suited for the production of printing reliefs after the manner disclosed in Plambeck U.S. Patent 2,760,863. They also are useful for affixing phosphors to surfaces to provide color television screens and for forming printed circuit diagrams. The printing reliefs made in accordance with this invention can be used in all classes of printing but are most applicable to those classes of printing wherein a distinct difference in height between printing and non-printing areas is required.

The advantage of this invention is that the elements do not lose exposure latitude when stored in air, and consequently no resenitization of the elements is necessary prior to use.

I claim:

1. A photopolymerizable, photosensitive element comprising (1) a support, (2) an antioxidant layer containing 0.1 to 500 milligrams per square centimeter of an oxygen reactant selected from a group consisting of red phosphorus, stannous chloride, chromous chloride, sodium sulfide and sodium dihydrogen phosphite, and (3) a solid photopolymerizable layer having a thickness of 3 to 250 mils and comprising (*a*) a non-gaseous ethylenically unsaturated monomer capable of forming a high polymer by photoinitiated addition polymerization, (*b*) an addition polymerization initiator activatable by actinic light and thermally inactive below 85° C., and (*c*) a cellulose carboxylic acid ester binding agent for the constituents of the photopolymerizable layer, said layer (2) being beneath and in surface contact with layer (3).

2. An element as defined in claim 1 wherein there is antihalation material beneath and in operative association with the photopolymerizable layer so that less than 35% of actinic light incident on the material is reflected into the photopolymerizable layer.

3. An element as set forth in claim 1 wherein said ester is cellulose acetate succinate.

4. An element as set forth in claim 1 wherein said unsaturated compound is taken from the group consisting of acrylic and alpha-alkacrylic acid esters of polyethylene glycols.

5. An element as set forth in claim 1 wherein said initiator is a polynuclear quinone having two intracyclic carbonyl groups attached to intracyclic carbon atoms in a conjugated six-membered ring, there being at least one aromatic carbocyclic ring fused to the ring containing the carbonyl groups.

6. An element as set forth in claim 1 wherein said initiator is anthraquinone.

References Cited in the file of this patent

UNITED STATES PATENTS

| | | |
|---|---|---|
| 2,432,865 | Dimsdale | Dec. 16, 1947 |
| 2,552,229 | Stauffer et al. | May 8, 1951 |
| 2,791,504 | Plambeck | May 7, 1957 |